United States Patent [19]

Beha et al.

[11] Patent Number: 4,706,018
[45] Date of Patent: Nov. 10, 1987

[54] NONCONTACT DYNAMIC TESTER FOR INTEGRATED CIRCUITS

[75] Inventors: Johannes G. Beha, Wädenswil, Switzerland; Russell W. Dreyfus, Mt. Kisco; Gary W. Rubloff, Katonah, both of N.Y.

[73] Assignee: International Business Machines Corporation, Armonk, N.Y.

[21] Appl. No.: 667,506

[22] Filed: Nov. 1, 1984

[51] Int. Cl.$^4$ .................. G01R 31/02; G01R 19/00
[52] U.S. Cl. ............................ 324/158 R; 324/73 R
[58] Field of Search .......... 324/158 D, 158 R, 158 F, 324/73 PC, 73 R; 29/574; 250/311; 356/399, 401, 237; 136/290

[56] References Cited

U.S. PATENT DOCUMENTS

| | | | |
|---|---|---|---|
| 3,129,353 | 4/1964 | Nemes | 250/311 |
| 3,370,168 | 2/1968 | Komoda | 250/311 |
| 4,266,138 | 5/1981 | Nelson, Jr. et al. | 250/492 A |
| 4,332,833 | 6/1982 | Aspnes et al. | 427/8 |
| 4,380,864 | 4/1983 | Das | 29/574 |
| 4,408,883 | 10/1983 | Iwamoto et al. | 356/355 |
| 4,417,948 | 11/1983 | Mayne-Banton et al. | 156/643 |
| 4,581,578 | 4/1986 | Honma et al. | 324/158 D |

FOREIGN PATENT DOCUMENTS 0129508 12/1984 France .

OTHER PUBLICATIONS

"Microwave Trapped Plasma Devices Observed on a 356 Hz Sampling Oscilloscope", Carroll et al., S0361-0043, pp. 545,547, 9/20/79, 324–158D.
"Scanning Electron Beam Probes VLSI Chips", Fazekas et al., S1777-0028, Electronics, 7/14/81, vol. 54, #14, pp. 105–112, 324–158R.
Rubloff, "Contactless Measurement of Voltage Levels Using Photoemission," IBM Technical Disclosure Bulletin, vol. 25, No. 3A, Aug. 1982, pp. 1171–1172.
Henley, "Logic Failure Analysis of CMOS Using a Laser Probe," Spectrum Sciences, 3050 Oakmead Village Drive, Santa Clara, Calif., 95051.
Rev. Scientific Instruments, vol. 49, No. 6, Jun. 1978, pp. 756–759, American Institute of Physics, New York, M. Kudo et al., "Computer Controlled ESCA for Nondestructive Surface Characterization Utilizing a TV-Type Position Sensitive Detector.
Fujitsu-Scientific & Technical Journal, vol. 19, No. 4, 1983, pp. 431–441, Kawasaki, Japan, A. Ito et al., "Hemispherical Retarding Type Energy Analyzer for LSI Testing by an Electron Beam".
Microelectronics Journal, vol. 11, No. 2, Mar./Apr. 1980, pp. 35–40, Mackintosh Publications Ltd., Luton, GB; C. E. Jowett, "Surface Analytical Techniques Applied to Electronic Components".
"Data Probe Model 2010 IC Logic Laser Analyzer," Mitsui & Co., 1984.
Menzel and Kubalek, "Secondary Electron Detection Systems for Quantitative Voltage Measurements," Scanning, Vol. 5, 151–171 (1983).

Primary Examiner—Reinhard J. Eisenzopf
Assistant Examiner—W. Burns
Attorney, Agent, or Firm—Carl C. Kling

[57] ABSTRACT

Testing of integrated circuit process intermediates, such as wafers, dise or chips in various stages of production (test chips) is facilitated by a nonintrusive, noncontact dynamic testing technique, using a pulsed laser, with laser light modification to increase photon energy through conversion to shorter wavelength. The high energy laser light excites electron emissions to pass to the detection system as a composite function of applied light energy and of dynamic operation of the circuit; detecting those emissions by an adjacent detector requires no ohmic contacts or special circuitry on the integrated circuit chip or wafer. Photoelectron energy emitted from a test pad on the test chip is detected as a composite function of the instantaneous input voltage as processed on the test chip, in dynamic operation including improper operation due to fault. The pulse from the laser, as modified through light modification, the parameters of detection of bias voltages, and the distances involved in chip-grid-detector juxtaposition, provides emissions for detection of circuit voltages occurring on the test chip under dynamic conditions simulating actual or stressed operation, with high time resolution of the voltages and their changes on the circuit.

11 Claims, 2 Drawing Figures

NONCONTACT DYNAMIC TESTER FOR INTEGRATED CIRCUITS

BACKGROUND OF THE INVENTION

1. Field of the Invention

This invention relates to integrated circuit testing, and more particularly to a nonintrusive noncontact dynamic testing technique using a pulsed laser to excite electron emissions as a function of dynamic operation of the circuit and to detect those emissions by an adjacent detector without the need for ohmic contacts or special circuitry on the integrated circuit chip or wafer.

2. Description of the Prior Art

A common way of testing an electronic circuit is a dynamic view of the circuit, voltage or currents, in operation, by means of an oscilloscope. The engineer probes the circuit at various test probe positions, for example by pricking certain landing pads with the points of test probes to make good contact, and views the resulting electrical conditions via analogous traces on the oscilloscope viewing tube. As circuits have become more compact and complex, it has become more and more difficult to accomplish nonintrusive positioning of test probe points without the danger of destroying the circuit, or at least of providing such a relatively enormous change due to the physical mass of the probes that the test becomes suspect. A totally nonintrusive contactless oscilloscope is a known desire. One approach to the contactless oscilloscope is the e-beam tester, but the e-beam is somewhat intrusive in that the high energy (100 electron volts or more) of the incident electrons may cause permanent material damage where the e-beam strikes the surface being tested.

U.S. Pat. No. 3,129,353, Nemes, "Multiple Radiation Source Microscope," Apr. 14, 1964, shows several accelerating energy electrodes in tandem, controlled as needed to apply a given amount of radiation energy to a test specimen in a plurality of summed wavelengths for examining the internal and external structure of a particular specimen in a microscope. Nemes does not make any attempt to measure voltage.

U.S. Pat. No. 3,370,168, Komoda, "Anode Aperture Plate For a Television Camera Tube in an Electron Microscope Comprising a Stainless Steel Foil," Feb. 20, 1968, shows an aperture plate for an electron microscope. The aperture plate is made of a thin highly light transmissive stainless steel layer in order to limit obstruction of the radiation travelling through the plate. Komoda is concerned with the electron bombardment induced conductivity. Komoda scans an induced-conductivity film with a low velocity scanning electron beam from an electron gun and uses the gain of the induced conductivity effect to control a fluorescent plate for providing the picture for television scanning. Komoda does provide an anode aperture plate made of stainless steel foil whose aperture part is heated by bombardment of a scanning electron beam. Komoda is not concerned with measuring voltages but rather is concerned with developing a television camera tube for installation in an electron microscope. The following are systems representative of the prior art: U.S. Pat. No. 4,266,138, Nelson et al, "Diamond Targets For Producing High Intensity Soft X-Rays & a Method of Exposing X-Ray Resists," May 5, 1981. Nelson shows a technique for exposing x-ray sensitive resists to carbon K x-rays using a type 2B diamond target which dissipates considerably more power and produces higher intensity x-rays than graphite targets. This is a production technique, not a testing technique.

U.S. Pat. No. 4,417,948, M. Baton, "Self-Developing Photoetching of Polyesters by Far UV Radiation," Nov. 29, 1983, describes a technique for photoetching polyesters by application of ultraviolet radiation in the presence of oxygen. This is also a production technique, not a testing technique.

U.S. Pat. No. 4,380,864, P. K. Das, "Method for Providing In-Situ Non-Destructive Monitoring of Semiconductors During Laser Annealing Process," Apr. 26, 1983. Das describes a technique for positioning a surface acoustic wave device adjacent to a semiconductor being annealed. Affixing an electrical contact to the top surface of the semiconductor and using a composite of the transverse surface acoustic wave and the charge carriers of the semiconductor to produce a transverse acoustal electric voltage which thus is a function of the semiconductor conductivity. This is a contact technique, not a contactless technique.

U.S. Pat. No. 4,332,833, Aspnes et al "Method for Optical Monitoring in Materials Fabrication," June 1, 1982. Aspnes et al, shows a technique for utilizing the sensitivity of the dielectric function of a crystal to crystalline volume fractions and recognizing that the volume fractions vary as a function of the measured dielectric function over an appropriate range of frequencies corresponding to photon energies of approximately 1.5 electron volts to 6 electron volts to do a dynamic monitoring of deposition within a reactor. This is a contactless optical technique for monitoring materials during thin film processing; it is not a current-voltage tester.

U.S. Pat. No. 4,408,883, Iwamoto et al, "Apparatus for Inspecting Average Size of Fundamental Patterns," Oct. 11, 1983. Iwamoto et al shows an apparatus for determining the average size of fundamental patterns by comparing Fourier transforms of pattern images in a processor and providing the patterns by applying coherent light focused on a target for test and monitoring the reflected images by converting them to Fourier transforms and comparing the Fourier transforms against known image patterns. This is a contactless optical technique for image recognition; it is not a current-voltage tester.

Fazekas, Feuerbaum and Wolfgang, "Scanning electron beam probes VLSI chips," Electronics Magazine, Vol. 54, No. 14, July 14, 1981, shows an electron beam probe for testing electronic chips. The Fazekas et al article shows a system for testing integrated circuits with an electron beam which for loadless probing they suggest a primary electron energy of 2-3 kiloelectron-volts to achieve a charge balance in which when one electron strikes the integrated circuit, another leaves it again. This permits voltage contrast in which secondary electrons emitted at a +5 volt metallic land are repelled by local electric fields while those from a ground pad are accelerated to a collector. Positive interconnections show up as dark in a resulting image, while negative ones show up as light. The E-beam is used to select a particular area for probing. Fazekas et al also shows how to do actual voltage measurements by using a secondary electron spectrometer added to the sampling electron microscope. The spectrometer extracts secondary electrons emitted by the integrated circuit, slows the electrons in a retarding field and then deflects them to the collector.

J. E. Carroll and J. K. A. Everard, Proceedings of the 9th European Microwave Conference, Microwave 79, Brighton, England, pages 543-547, 17-20, 1979, shows a technique for using a pulsed laser as a light radiation source, with frequency and energy level being adjusted by tandem harmonic generators. The Carroll et al article splits the laser pulse in order to get different laser pulse wavelengths to cause penetration to different levels in a Trapatt diode under study. Carroll et al thus shows that a laser light can be split into red and green fractions for use in sampling a diode under test. Carroll et al does not use the laser light to activate photoemission of a sample but rather uses the laser simply as a timing device for varying time of injection of optically generated charge.

Rubloff, "Contactless Measurement of Voltage Levels Using Photoemission," IBM Technical Disclosure Bulletin, Vol. 25, No. 3A, August 1982, pp. 1171–1172, shows ultraviolet light stimulation of photoemission for contactless measurement of voltage levels, but not in the context of dynamic testing, and not with a laser (c.w., or pulsed). The author is a coinventor. Henley, "Logic Failure Analysis of CMOS Using a Laser Probe," Spectrum Sciences, 3050 Oakmead Village Drive, Santa Clara, Calif., 95051, shows a laser contactless probe for an integrated circuit, using available pin connections to conduct stimulated current-voltage signals to a computer for analysis. Henley does not use an adjacent detector, but must dedicate a certain amount of circuitry (external to the integrated circuit under test) to the conduction of test signals. No photoemission from the circuit is created. The logic state of the integrated circuit is determined by interrupting its dynamic operation and then measuring the current transient induced in the power supply by laser light absorption in an active semiconductor region (the light does not impinge on the metal wires and nodes of the circuit); as a result, neither logic states nor AC switching waveforms are determined during dynamic operation of the circuit.

The prior art does not teach nor suggest the invention, the technique of stimulating electron emission signals from in an integrated circuit by the use of a pulsed laser for accurate time-resolution, without actual contact, by focussing a modified laser beam on a portion of the integrated circuit while in operation with signal dynamics, and monitoring those emissions for test against appropriate norms, to determine whether the integrated circuit is operating properly.

SUMMARY OF THE INVENTION

Therefore, it is an object of the present invention to accomplish a noncontact test of an integrated circuit, by monitoring instantaneous voltage at a laser selected node in the integrated circuit, by stimulating electron emissions from the integrated circuit under test, which emissions vary as a function of instantaneous voltage at the laser-selected node. A modified pulsed laser beam is focussed on a node of the integrated circuit under test while under operation with signal dynamics, and while monitoring those emissions for test again appropriate norms.

A feature of the invention is its operation as a nonintrusive probeless oscilloscope, with time resolution on the order of 5 picoseconds, and thus with ability to measure AC switching transients during change in logic states, as well as logic states themselves for most advanced high speed circuits.

An advantage of the invention is that it operates without requiring human dexterity, with great precision, and without damage to the integrated circuit under test.

The foregoing and other objects, features and advantages of the invention will be apparent from the more particular description of the preferred embodiments of the invention, as illustrated in the accompanying drawing.

DESCRIPTION OF A PREFERRED EMBODIMENT

Figures 1, 2:
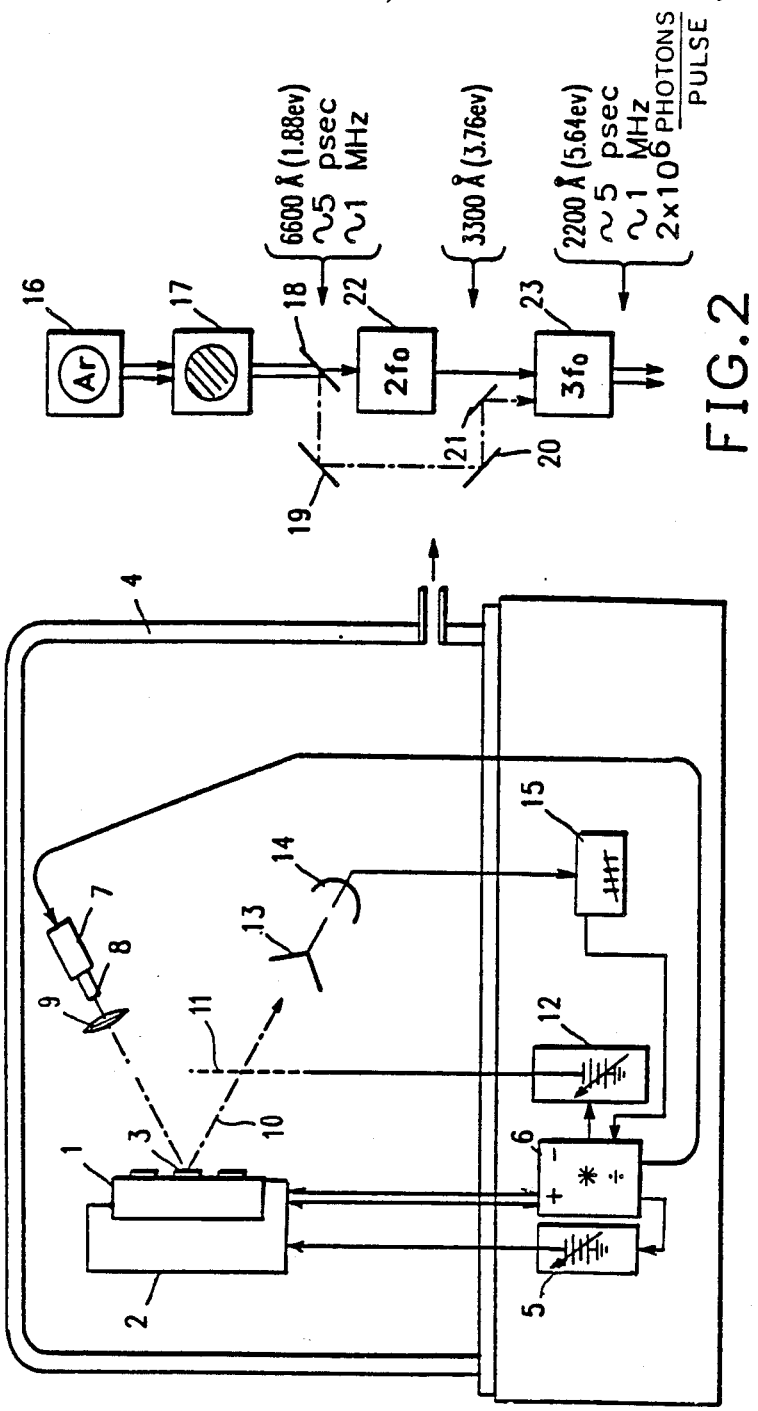
FIG. 1 is a schematic diagram of the contactless tester for integrated circuits.
FIG. 2 is a schematic diagram of the laser modification technique used to provide focused light for stimulating signal modulated emissions as a function of signal dynamics in the integrated circuit under test.

FIG. 1 is a schematic diagram of the contactless tester for integrated circuit process intermediates, which may include wafers, dice or chips in various stages of manufacture. These process intermediates may be simple or may be complex; it is common to have complex semiconductor doping areas embedded in a silicon substrate, covered with several layers of metallization interspersed with several layers of insulation or passivation. For ease of discussion, all such integrated circuit process intermediates will be identified merely as "test chips." The test chip 1 is mounted in a suitable mounting means 2 which provides connections for dynamic signals simulating operation and does not obscure passage of light to contact pads such as pad 3. The entire operation is carried out in an environmental chamber 4 which provides appropriate operating environment vacuum for the integrated circuit test. Test chip 1 is supplied with suitable bias voltages from bias source 5 and is supplied with appropriate dynamic operating signals from signal generator and test computer 6. Bias source 5 is shown in FIG. 1 as a variable battery; in practice, it may be a computer controlled variable votlage supply such as a number of different voltage supplies separately gated by the computer 6. Bias source 5, under computer control, thus can provide operating bias voltage or an off-specification bias voltage to simulate stressed operation. Signal generator and test computer 6 is equipped to provide an appropriate dynamic exercise to test chip 1 so as to facilitate the test at the operating speed for which the circuit normally is run. The test chip 1 can also be dynamically stressed by high speed or off specification voltages, currents or timings. Once test chip 1 has been exercised to the point of operating temperature and to the point where a signal of known characteristics is expected at pad 3, it is desired to determine whether the appropriate signal is present or not. Laser 7 with laser light modulation mechanism 8 and focussing mechanism 9 applies a focussed laser beam of appropriate characteristics focused upon pad 3 in such a manner that pad 3 emits signal modulated electron emissions 10 as a composite function of the applied laser light and the integrated circuit signal available at pad 3 at the instant of the test. Emissions 10 pass through detector bias means (grid 11 and bias source 12 shown) and if of appropriate signal characteristics pass the detector bias means to detector 13. Bias source 12 is shown in FIG. 1 as a variable battery similar to bias source 5; like bias source 5, bias source 12 may take a variety of forms, so long as the detector bias is appropriate to the detector and to the test being performed. The detection means comprises a retarding electric field, through which the electrons pass, such that only those electrons with energies above a critical value (for example, 1 eV for a 1 eV retarding voltage difference between detector system and chip test point) reach the detector system and are measured.

The preferred detector system includes detector 13, collector 14 and counter 15. Detector 13 is a channel electron multiplier or other electron signal measuring detector which supplies electrons via collector 14 to electron counting circuit 15. A suitable electron multiplier is Galileo Electrooptics 4219 or 4730, for example. The electron multiplier, associated electron collector and pulse discrimination counter or current measuring amplifier together form detector means. A suitable electron collector may be simply a piece of stainless steel sheet formed into a dish, or a "last dynode" or electrode connected to a current measurer. Electron counts are fed back to the test signal generator 6 for comparison against appropriate test norms and determination of test results for use in further testing acceptance or rejection of integrated circuit 1.

FIG. 2 is a schematic diagram of the laser modification technique used to provide focused light with appropriate parameters for stimulating signal modulated emissions as a function of signal dynamics in the integrated circuit under test. Laser 7 in FIG. 1 preferably is a composite laser having a first stage 16 which is a CW pumped laser (argon ion, or YAG) and having a second stage 17 which is a mode-locked dye laser. The composite laser provides an output of collimated light at 6600A (1.88 eV) with a nominal 5 psec pulse width and a nominal 1 Mhz repetition rate. In order to shift the laser energy of 1.88 eV from composite laser 16,17 to an energy above threshold (4.2 eV) required to cause photoelectron emission into vacuum, the nonlinear optical properties of crystals under intense laser illumination are used for harmonic generation, so that the energies of two laser photons can be added to yield a single higher-energy laser photon. Second harmonic generating crystal 22 produces 3.76 eV photons by combining 1.88 eV photons two at a time. To these 3.76 eV photons more 1.88 eV photons are combined (using the mirror system 18-21 with mirror 18 being semitransparent) in third harmonic generating crystal 23, producing 5.64 eV photons from combinations of 3.76 and 1.88 eV photons. The resulting high energy laser photons (5.64 eV in this case) have sufficient energy to excite the photoelectron emission during the nominal 5 psec pulse width of the laser pulses, so that the emission carries direct information on the voltage state of the pad 3 (FIG. 1) during the very short laser pulse. By varying the arrival time of the laser pulse relative to the clock of the integrated circuit, the voltage and switching behavior of pad 3 during circuit operation is determined. With this laser embodiment, repetition and measurement rates of nominal 1 Mhz are achieved. Typically, the laser photon flux from such a system is $2 \times 10^6$ photons/pulse. This light signal is appropriate to provide signal modulated emissions 10, FIG. 1, as a composite function of the focussed laser beam and the signal dynamics in operation of integrated circuit 1 as expressed by signal at pad 3.

The following characteristics are demonstrative of appropriate operating characteristics and components; insofar as possible these items are keyed to FIG. 1 or FIG. 2:

Composite laser 7 of FIG. 1, and lasers 16 and 17 of FIG. 2 are a composite of a mode-locked dye laser pumped by a CW argon ion or YAG-laser.

Lens 9, grid 11, detector 13, collector 14, and counter 15 are:
Lens 9=compound ultraviolet lens (quartz, sapphire).
Grid 11=stainless steel fine mesh grid approx. 80% transmission;
Detector 13=channel electron amplifier.
Collector 14=stainless steel cup.
Counter 15=fast electron pulse counting system.

The characteristics of signal generator and test computer 6 are those of a high speed logic testing system, of any type now common to the art of testing an integrated circuit by exercising it under dynamic conditions simulating actual or stressed operation.

The operating environment within chamber 4 is vacuum with approximately $10^{-5}$, $10^{-6}$ torr base pressure (or lower).

The electron emission signal 10 caused by the laser pulse carries a characteristic distribution of electron energies. When the voltage at pad 3 is more positive relative to the grid 11, more electrons in emission signal 10 are retarded from passing the grid 11 to be measured by the detection system 13-15; thus the emission signal 10 as measured by the detection system consisting of grid system 11, 12 and detection system 13-15 reflects the voltage at pad 3 during the laser pulse, which can be sufficiently fast, for example, nominal 5 picoseconds for very high speed circuits, to resolve the AC switching transient accompanying a change in logic state of pad 3 (as well as the logic state itself).

Other embodiments of the bias and detection systems may be substituted. Grid 11 may in certain situations be eliminated; without the grid the front surface of detector 13 functions as bias means in that the voltage between pad 3 and detector 13 determines the number of electrons arriving at detector 13. Such detection systems are sensitive to both the primary (directly ejected) photoelectrons and resulting secondary electrons, energy distributions of which are illustrated in the photoemission diagram in Rubloff, IBM Technical Disclosure Bulletin, Vol. 25, p. 1171, 1982. In this case, where the signal consists of all electrons with energies above a critical value for detection (similar to a high pass filter), enhanced sensitivity may be achieved by choosing the laser photon energy for the selected material of the test pad, typically aluminum, to be close to the photoelectron emission threshold. An alternative detection system is a bandpass electron energy analyzer which detects only electrons arriving at the analyzer with a specific energy. In this case, sensitivity advantages may accrue by choosing the laser photon energy notably above the photoelectron emission threshold (for example, 1-2 eV above). In both cases, the sensitivity is enhanced by preferential measurement of electrons at the transitions (thresholds) of the secondary and primary electron energy distribution spectra. Other embodiments of the composite pulsed laser system may also be used. These may include, for example, Raman shift lasers (using stimulated Raman scattering to change photon energy); frequency mixing laser systems, (more general than harmonic generation); excimer laser systems, dye laser systems, second harmonic generation (without third harmonic generation), and others. While the invention has been described with respect to a preferred embodiment, with several suggested changes of laser light sources and other changes, it will be obvious to one skilled in the art that various light sources and various detection schemes might be substituted for those described, without departing from the spirit or from the scope of the invention, so long as the light focussed on the test chip pad is above the threshold of eV value known to stimulate emission, and below the value which could cause damage to the integrated circuit or integrated circuit process intermediate under test.

What is claimed is:

1. A system for dynamic testing of an integrated circuit process intermediate test chip during exercise, characterized by:
   (a) mounting means, including a vacuum chamber with a test chip site for mounting a test chip for both electronic exercise and access by radiation;
   (b) circuit exercise means, connected via said mounting means to the test chip;
   (c) pulsed laser means, providing a sharply focussed, very short duration pulse of light, having parameters of controlled wavelength sufficiently short to cause emission of photoelectrons and resulting secondary electrons, to selected positions on a test chip mounted in said test chip site; and
   (d) detector means, juxtaposed to said mounting means adjacent said test chip site, to detect photoelectron energy emitted from a test pad on the test chip as a composite function of an instantaneous input voltage as processed by exercise of the test chip, including proper operation and also including improper operation due to fault, said parameters of the pulse from said laser means, and the parameters of any bias voltages included in said detector means;
   whereby detection of circuit voltages occurring on the test chip under dynamic conditions simulating conditions of actual or stressed operation is facilitated.

2. A system for dynamic testing of integrated circuit process intermediates according to claim 1, further characterized in that:
   said pulsed laser means (c) comprises laser modifications means, connected to said pulsed laser means, effective to modify laser light from said pulsed laser means to provide laser photon energy equal to or greater than 4.2 eV.

3. A system for dynamic testing of integrated circuit process intermediates according to claim 1, further characterized in that:
   said detector means (d) comprises a bandpass electron energy analyzer to detect only electrons with energies lying within a limited range of values.

4. A system of dynamic testing of integrated circuit process intermediates according to claim 1, further characterized in that:
   said detector means (d) comprises collector means (14) and chip test bias means (11,12) which provides a retarding electric field through which electrons with energies above a critical value, greater than a retarding voltage of said chip test bias means, pass to said collector means and are measured.

5. A system for dynamic testing of integrated circuit process intermediates according to claim 1, further characterized in that:
   energy of said laser means is controlled close to an emission threshold for secondary electrons for improved sensitivity.

6. A system for dynamic testing of integrated circuit process intermediates according to claim 2, further characterized in that:
   the energy of said laser modification means is controlled close to are emission threshold for primary electrons for improved sensitivity.

7. A system for dynamic testing of integrated circuit process
   intermediates characterized by:
   (a) mounting means 2, including a vacuum chamber 4 with a test chip site for mounting a test chip 1, both electronically exercisable and accessible by radiation;
   (b) laser means 7;
   (c) laser modification means 8, operating with said laser means to provide a sharply focussed, very short duration pulse of controlled wavelength and at a controlled elevated photon energy to selected positions on a test chip mounted in said test chip site;
   (d) detector bias means 11,12 juxtaposed to said mounting means 2 adjacent said test chip site; and
   (e) detection means 13,14 juxtaposed to said mounting means adjacent said test chip site, outboard of said detector bias means; whereby photoelectron energy emitted from a test pad on the test chip is detected as a composite function of an instantaneous input voltage as processed on the test chip, including proper operation and also including improper operation due to fault, parameters of the pulse from said laser modification means, parameters of bias voltages on said detector bias means, and distances involved in test chip-detector bias means-detection means juxtaposition, thus providing detection of circuit voltages occurring on the test chip under dynamic conditions simulating actual or stressed operation.

8. A system for dynamic testing of integrated circuit process intermdiates according to claim 7 further characterized in that:
   said detector bias means comprises a grid of stainless steel mesh having high light transmittivity.

9. A system for dynamic testing of integrated circuit process intermediates according to claim 7 further characterized in that:
   the energy of said laser modification means is controlled close to an emission threshold for secondary electrons for improved sensitivity.

10. A system for dynamic testing of an integrated circuit process intermediate test chip during exercise, characterized by:
    (a) mounting means, including a vacuum chamber with a test chip site for mounting a test chip for both electronic exercise and access by radiation;
    (b) circuit exercise means, connected via said mounting means to the test chip;
    (c) pulsed laser means, providing a sharply focussed, very short duration pulse of light, having parameters of controlled wavelength sufficiently short to cause emission of photoelectrons and resulting secondary electrons, to selected positions on a test chip mounted in said test chip site; and
    (d) detector means, juxtaposed to said mounting means adjacent said test chip site, to detect photoelectron energy emitted from a test pad on the test chip as a composite function of an instantaneous input voltage as processed by exercise of the test chip, including proper operation and also including improper operation due to fault, said parameters of the pulse from said pulsed laser means, and the parameters of any bias voltages included in said detector means;

whereby detection of circuit voltages occurring on the test chip under dynamic conditions simulating conditions of actual or stressed operation is facilitated;

further characterized in that said pulsed laser means (c) comprises laser modification means (8) effective to modify laser light from said pulsed laser means to provide laser photon energy equal to or greater than 4.2 eV; and said laser modification means (8) comprises fundamental frequency generating means, second harmonic generating means, and third harmonic generating means, all in tandem, effective to modify laser light to high electron energy at decreased wavelength.

11. A system for dynamic testing of integrated circuit process intermediates, characterized by:

(a) mounting means (2), including a vacuum chamber (4) with a test chip site for mounting a test chip (1), both electronically exercisable and accessible by radiation;

(b) laser means (7);

(c) laser modification means (8), operating with said laser means to provide a sharply focussed, very short duration pulse having parameters of controlled wavelength and controlled elevated photon energy to selected positions on a test chip mounted in said test chip site;

(d) detector bias means (11,12) juxtaposed to said mounting means (2) adjacent said test chip site; and (e) detection means (13,14) juxtaposed to said mounting means adjacent said test chip site, outboard of said detector bias means;

whereby photoelectron energy emitted from a test pad on the test chip is detected as a composite function of an instantaneous input voltage as processed on the test chip, including proper operation and also including improper operation due to fault, parameters of the pulse from said laser modification means, parameters of bias voltages on said detector bias means, and distances involved in test chip-detector bias means-detection means juxtaposition, thus providing detection of circuit voltages occurring on the test chip under dynamic conditions simulating actual or stressed operation;

further characterized in that:

said laser means provides a light at a fundamental frequency, and said laser modification means comprises second harmonic generating means and third harmonic generating means, in tandem, effective to modify laser light to high electron energy at decreased wavelengths.

* * * * *